United States Patent
Rue (10) Patent No.: US 9,443,697 B2
(45) Date of Patent: Sep. 13, 2016

(54) LOW ENERGY ION BEAM ETCH

(71) Applicant: FEI Company, Hillsboro, OR (US)

(72) Inventor: Chad Rue, Portland, OR (US)

(73) Assignee: FEI COMPANY, Hillsboro, OR (US)

(*) Notice: Subject to any disclaimer, the term of this patent is extended or adjusted under 35 U.S.C. 154(b) by 767 days.

(21) Appl. No.: 13/717,272

(22) Filed: Dec. 17, 2012

(65) Prior Publication Data

US 2013/0248356 A1  Sep. 26, 2013

Related U.S. Application Data

(60) Provisional application No. 61/593,281, filed on Jan. 31, 2012.

(51) Int. Cl.

| | |
|---|---|
| C23C 14/14 | (2006.01) |
| H01J 37/305 | (2006.01) |
| C23C 14/46 | (2006.01) |
| C23F 1/00 | (2006.01) |
| C23F 1/02 | (2006.01) |
| C23C 14/02 | (2006.01) |
| H01L 21/311 | (2006.01) |

(52) U.S. Cl.
CPC ......... *H01J 37/3053* (2013.01); *C23C 14/022* (2013.01); *C23C 14/46* (2013.01); *C23F 1/00* (2013.01); *C23F 1/02* (2013.01); *H01L 21/31138* (2013.01); *H01J 2237/3174* (2013.01)

(58) Field of Classification Search
CPC ... H01J 37/3053; C23C 14/022; C23C 14/46
See application file for complete search history.

(56) References Cited

U.S. PATENT DOCUMENTS

| | | | |
|---|---|---|---|
| 5,958,799 A * | 9/1999 | Russell et al. | 438/712 |
| 6,140,655 A | 10/2000 | Russell et al. | |
| 6,211,527 B1 | 4/2001 | Chandler | |
| 6,268,608 B1 | 7/2001 | Chandler | |
| 6,319,884 B2 | 11/2001 | Leduc et al. | |
| 7,670,956 B2 * | 3/2010 | Bret et al. | 438/709 |
| 2003/0047691 A1 * | 3/2003 | Musil et al. | 250/492.2 |
| 2008/0314871 A1 * | 12/2008 | Toth et al. | 216/48 |
| 2010/0197142 A1 | 8/2010 | Randolph et al. | |

OTHER PUBLICATIONS

Efremow, N. N., et al., "Ion-beam-assisted etching of diamond." J. Vac. Sci. Technol. B, 1985, pp. 416-418, vol. 3, No. 1.

Lucas, B., et al., "Ion Beam Assisted Etching of a Fluorinated Polyimide in order to Insert it in an Electro-Optical System," Synthetic Metals, 1999, pp. 1423-1424, vol. 102.

* cited by examiner

*Primary Examiner* — Jason M Berman (74) *Attorney, Agent, or Firm* — Scheinberg & Associates, P.C.; John E. Hillert; Michael O. Scheinberg (57) ABSTRACT

A carbonaceous material is removed using a low energy focused ion beam in the presence of an etch-assisting gas. Applicant has discovered that when the beam energy of the FIB is lowered, an etch-assisting gas, such as $O_2$, greatly increases the etch rate. In one example, polyimide material etched using a $Xe^+$ plasma FIB with a beam energy from 8 keV to 14 keV and $O_2$ as an etch-assisting gas, the increase in etch rate can approach 30× as compared to the default mill rate.

21 Claims, 12 Drawing Sheets

LOW ENERGY ION BEAM ETCH

This application claims priority from U.S. Provisional Application 61/593,281, filed Jan. 31, 2012, which is hereby incorporated by reference.

TECHNICAL FIELD OF THE INVENTION

The present invention relates to focused ion beam etching of polyimide or other similar organic films, more specifically to etching polyimide using a $Xe^+$ plasma focused ion beam.

BACKGROUND OF THE INVENTION

Modern integrated circuits (ICs) are composed of multiple layers of conductors and substrate materials, such as insulators and semiconductors. Inspecting and editing a circuit or other hidden interior feature in an IC requires navigating to the target area and milling through one or more of the multiple layers of substrate material. Circuit Edit (CE) reduces IC development costs by reducing the number of mask sets that are required during the design-debug phase, and speeds overall time-to-market.

Most CE activities today are performed with Focused Ion Beam (FIB) systems, which are commonly used to mill away a substrate material to expose hidden features and also deposit materials with high precision. These capabilities can be used to cut and connect circuitry within a device, as well as to create probe points for electrical test. Applications include validating design changes, debugging and optimizing devices in production, and prototyping new devices without costly and time-consuming mask set fabrication.

Typically material removal in FIB systems is accomplished by using beams of relatively large ions to physically sputter away the substrate material. Most FIB systems use gallium ions (Ga+) produced by a Liquid Metal Ion Source (LMIS) because such sources are easy to fabricate, operate at room temperature, and are reliable, long lived, and stable. In addition, chemical agents can be introduced onto the work piece during FIB processing, to favorably manipulate the milling rates of selected materials. The use of chemical agents to enhance or suppress FIB milling rates is generally referred to as "Gas-Assisted Etching" (GAE).

Because polyimide (PI) is a common encapsulating material on IC package devices, it is often necessary to remove a portion of a polyimide layer during circuit edit or failure analysis. On common method of polyimide removal is by etching the polyimide layer with a Ga+ FIB in the presence of water vapor. The water acts as an etch-assisting gas and is known to increase the polyimide etch rate by a factor of 5 to 10 times the default milling rate (defined as the milling rate using the FIB without an etch-assisting gas). The use of water vapor as an etch-assisting gas for organic (carbon containing) compounds such as polyimide is described in U.S. Pat. No. 5,958,799 to Russell et al., for "Method for water vapor enhanced charged-particle-beam machining" (Sep. 28, 1999), which is hereby incorporated by reference.

While the Ga+ FIB has been the most common type of FIB used in IC manufacturing for decades, plasma FIB instruments using inert ions such as xenon ions ($Xe^+$) offer a number of significant advantages to the traditional Ga+ FIB using a liquid metal ion source. For example, a plasma FIB provides beam currents which are 20 to 100× the beam currents used in traditional gallium-based FIBs, which results in a tremendous increase in material removal rates. Also, plasma FIBs using inert ions do not result in problematic ion contamination such as that caused by Ga+ implantation.

One significant disadvantage of using a plasma FIB such as a $Xe^+$ plasma FIB for circuit edit or failure analysis on IC package devices encapsulated by polyimide or other similar organic films is that water vapor does not appear to act as an etch-assisting gas for polyimide when used with a $X^+$ plasma FIB. Although other ex-situ (outside the FIB vacuum chamber) methods of polyimide removal are known, including lasers and plasma etching tools, no effective in-situ methodology for $Xe^+$ FIB tools is known in the prior art.

Accordingly, what is needed is method for more rapid and efficient in-situ etching of Polyimide and other organic films using a $Xe^+$ plasma beam.

SUMMARY OF THE INVENTION

A preferred embodiment of the present invention is directed to a novel method of chemical-assisted ion beam etching of a carbonaceous or other organic material.

Applicant has discovered that when the beam energy is lowered, an oxygen containing gas such as $O_2$ begins to function as a very effective etch-assisting gas. For example, embodiments using a $Xe^+$ plasma FIB having a beam energy from 8 keV to 14 keV and $O_2$ as an etch-assisting gas, can etch polyimide at a rate that approaches 30× the default mill rate of polyimide.

The foregoing has outlined rather broadly the features and technical advantages of the present invention in order that the detailed description of the invention that follows may be better understood. Additional features and advantages of the invention will be described hereinafter. It should be appreciated by those skilled in the art that the conception and specific embodiments disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more thorough understanding of the present invention, and advantages thereof, reference is now made to the following descriptions taken in conjunction with the accompanying drawings, in which.

The accompanying drawings are not intended to be drawn to scale. In the drawings, each identical or nearly identical component that is illustrated in various figures is represented by a like numeral. For purposes of clarity, not every component may be labeled in every drawing.

DETAILED DESCRIPTION OF PREFERRED EMBODIMENTS

Preferred embodiments of the present invention are directed at a novel method of polyimide removal using a $Xe^+$ plasma FIB. Using pure oxygen gas ($O_2$) as an etch-assisting gas also does not have much if any effect upon the etching rate of PI when used at relatively high beam energies (>20 keV). Applicant has discovered, however, that when the beam energy of the $Xe^+$ plasma FIB is lowered, $O_2$ begins to function as a very effective etch-assisting gas. Depending upon the particular polyimide composition, using a $Xe^+$ plasma FIB with a beam energy from 8 keV to 14 keV and $O_2$ as an etch-assisting gas, according to a preferred embodiment of the present invention, the increase in etch rate can approach 30× as compared to the default mill rate.

The traditional approach for etching polyimide (PI) films using Ga+FIB is to use water vapor as an etch-assisting gas. This technique results in PI removal rates of approximately 2 $\mu m^3$/nC at an acceleration voltage (also referred to as beam energy) of 30 keV, although actual removal rates will show considerable variation depending upon the exact type of PI being removed. As discussed above, this removal rate is typically 5× to 10× faster than the default mill rate (for the FIB with no etch-assisting gas).

Although the use of $Xe^+$ plasma FIB has a number of advantages over more traditional $Ga^+$ FIB, the use of water vapor ($H_2O$) does not appreciably increase the etch rate of PI when using a $Xe^+$ plasma FIB at any beam energy. Using pure oxygen gas ($O_2$) as an etch-assisting gas also does not have much if any effect upon the etching rate of PI when used at relatively high beam energies (>20 keV).

Surprisingly, however, Applicant has discovered that when the beam energy of the $Xe^+$ plasma FIB is lowered, $O_2$ begins to function as a very effective etch-assisting gas. As described in greater detail below, a typical default milling rate for polyimide etching using the $Xe^+$ plasma FIB might be approximately 0.3 $\mu m^3$/nC. At a beam energy of 30 keV, the addition of $O_2$ will have little or no effect upon the etch rate of the polyimide. As the beam energy is lowered, however, an improvement in etch rate starts to be seen at <16 keV, with the most significant increase seen in the range of 8 to 14 keV. Depending upon the particular polyimide composition, the increase in etch rate using a preferred embodiment of the present invention can approach 30× as compared to the default mill rate.

Although much of the discussion herein is limited to etching polyimide using a $Xe^+$ plasma FIB, some embodiments of the invention can make use of other types of focused ion beams, including FIB systems using conventional liquid metal ion sources or plasma FIBs using a different ion species. Likewise, embodiments of the present invention can be used, not only with polyimide, but also with other similar organic films.

Figure 1:
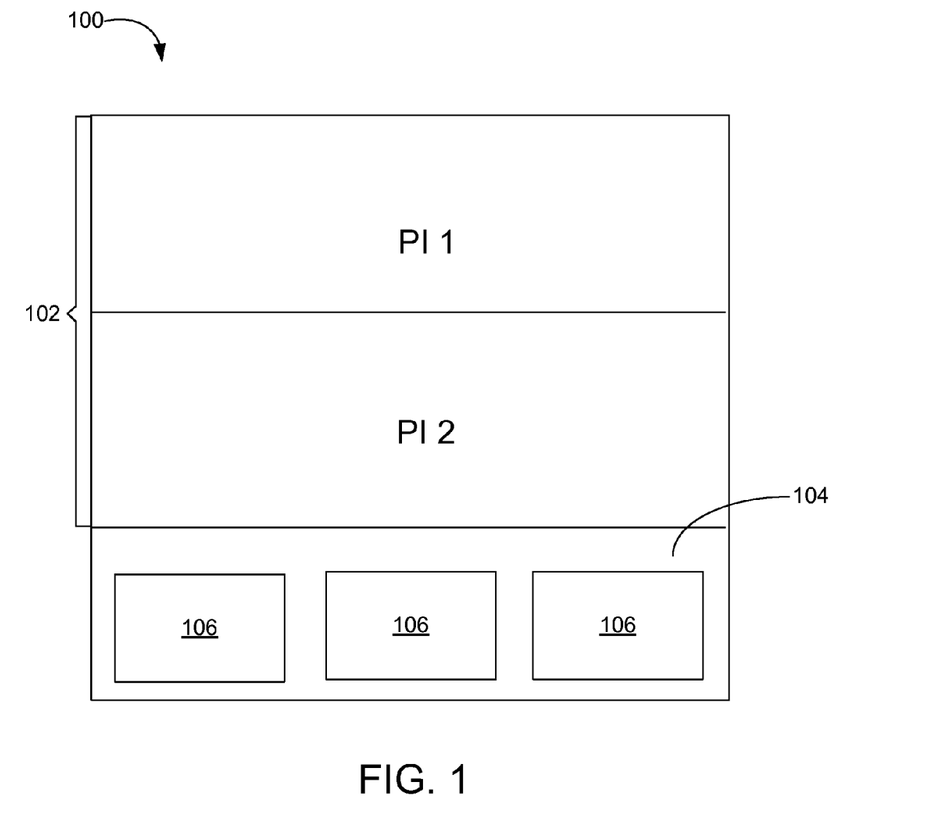
FIG. 1 is a schematic diagram illustrating a portion of a typical IC package device with an encapsulating polyimide layer.

FIG. 1 is a schematic cross-sectional diagram illustrating a portion of a typical IC package device 100 with an encapsulating polyimide layer 102, a layer of silicon dioxide 104 that functions as an etch stop (discussed below), and a number of metal lines 106. In the IC package device of FIG. 1, the polyimide has been deposited in two steps, resulting in two polyimide layers (PI 1 and PI 2) that can be slightly differentiated from one another. The goal in a typical simplified example of a circuit edit or failure analysis might be to expose metal lines 106 by first milling or etching away the polyimide layer 102.

Figure 2:
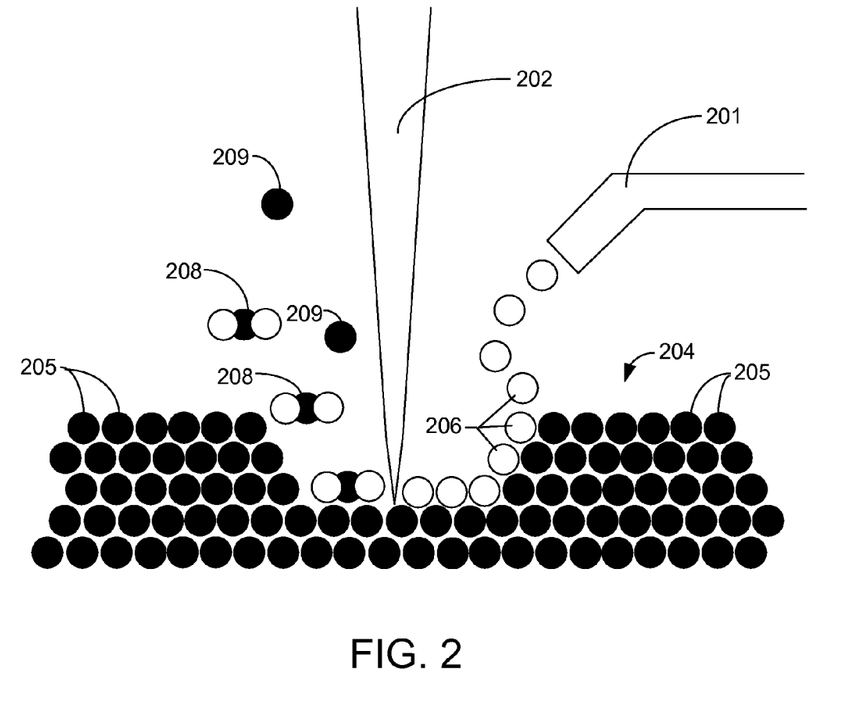
FIG. 2 is a schematic illustration of a typical gas-assisted etching process using a FIB.

FIG. 2 is a schematic illustration of a typical gas-assisted etching process using a FIB 202 to process a work piece. As discussed above, material removal in FIB systems can be accomplished by using beams of relatively large ions to physically sputter away material from the work piece 204. Sputtering by an FIB system can be further enhanced, and some of the previously described problems can be minimized, by using an etching gas (referred to as a precursor gas) that is introduced near to the work piece surface through a gas delivery nozzle 201 so that gas molecules 206 are adsorbed onto the surface.

Scanning the ion beam 202 over the defined area induces localized heating of the substrate surface, i.e., enhanced local phonon densities. These phonons are believed to activate (or crack) the adsorbed molecules 206 of the precursor gas, possibly in conjunction with secondary electrons induced by ion beam 202. These activated absorbed molecules 206 then react with the surface molecules 205 to promote etching of the underlying surface. Volatile products 208 of the process then leave the surface and are pumped away by the vacuum system, along with some surface molecules removed by sputtering. Some etching gases may directly react with the work piece surface (i.e. no activation from the beam is necessary).

Figure 3:
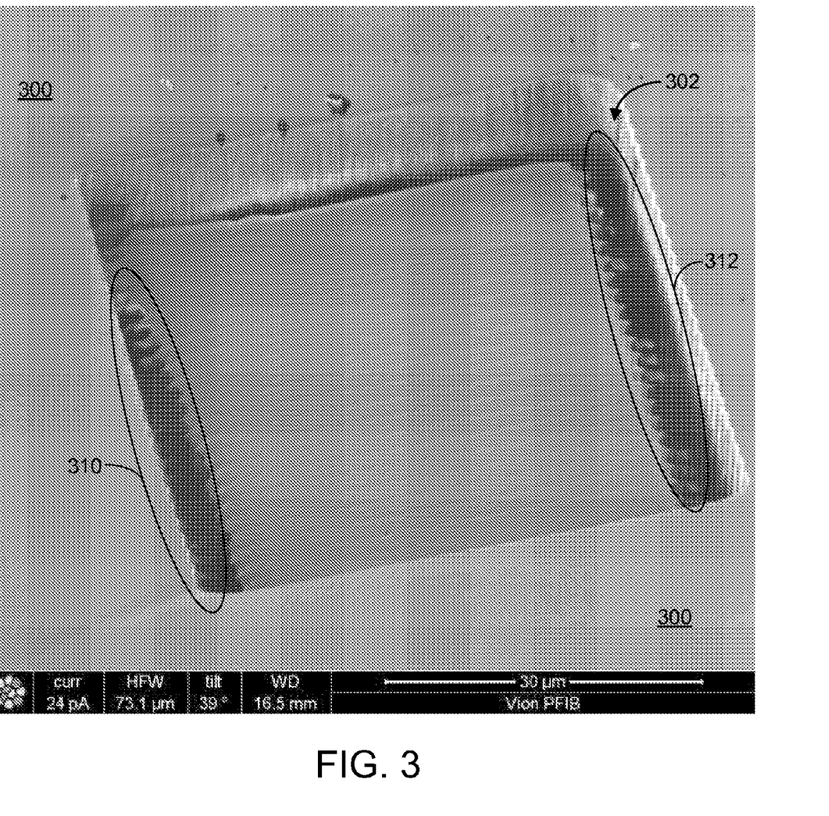
FIG. 3 is a photomicrograph of a polyimide etch using a higher energy $Xe^+$ plasma ion beam.

FIG. 3 is a photomicrograph (using the FIB to image the work piece) of a polyimide etch using a higher energy $Xe^+$ plasma ion beam. As shown in FIG. 3, a portion of the polyimide 300 has been etched away in box 302, although the floor 304 of the milled box is still polyimide so not all of the desired polyimide material has been removed. Significantly, the polyimide surface, both in and out of the milled box, appears a light gray in the image. An electrically insulating material such as polyimide should appear dark in this type of FIB image. The change in contrast is an indication that the polyimide has been rendered electrically conductive as a result of damage caused by the ion beam. Although the exact mechanism of damage is unclear at this time, Applicant theorizes that the beam energy has rearranged the molecules in such a fashion as to render the upper surface (which has been exposed to the beam for either milling or imaging) electrically conductive to some degree.

Applicant also believes that this damage results in the formation of a passivation layer that is chemically resistant to the oxygen being used as the etching gas. That is, polyimide damaged with a 30 keV ion beam (e.g., $Xe^+$) is significantly less reactive than undamaged polyimide. As seen in FIG. 3, the darker, undamaged polyimide at the edges of the floor of the milled box, in the areas indicated by dashed circles 310 and 312, appear to have been etched to a greater degree than the lighter gray areas.

Figure 4:
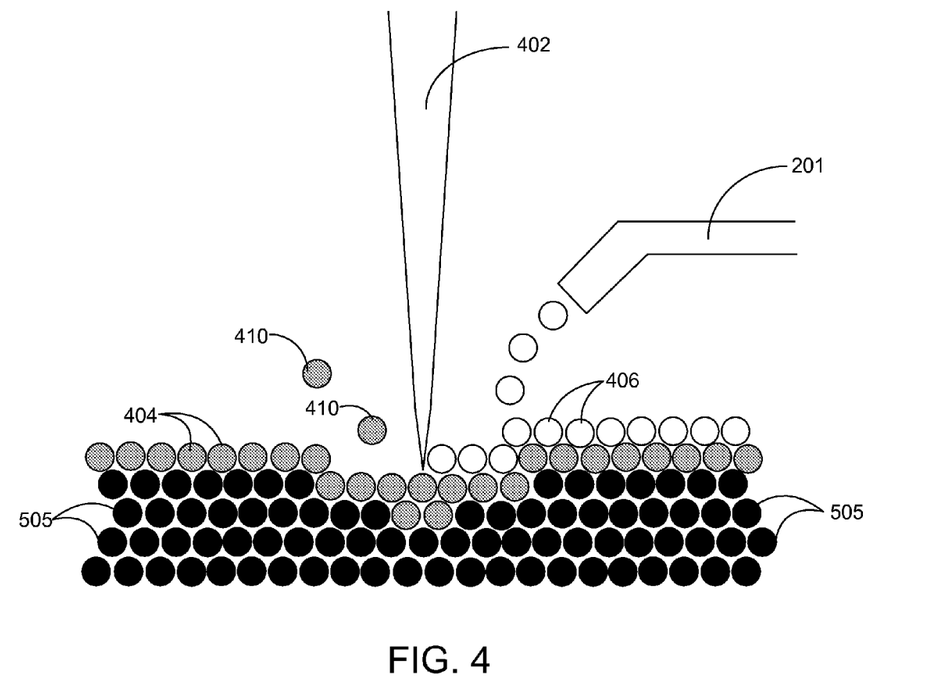
FIG. 4 is a schematic illustration of gas-assisted etching using the $Xe^+$ plasma FIB at higher acceleration voltages.

FIG. 4 is a schematic illustration of gas-assisted etching using the $Xe^+$ plasma FIB at higher acceleration voltages (>16 keV). As in FIG. 2, an etching gas (in this case $O_2$) is introduced near to the work piece surface so that gas molecules 406 are adsorbed onto the surface. Applicant believes that the higher energy ions in the $Xe^+$ plasma FIB 402 react with the surface molecules 405 to cause the formation of passivation layer 404, which does not significantly react with oxygen to promote etching. As a result, ion sputtering is the only significant mechanism for material removal. And as the ion beam sputters away the damaged polyimide molecules 410, it is also damaging the underlying polyimide molecules 405 so that the oxygen chemistry has almost no opportunity to assist the etching of undamaged polyimide.

Figure 5:
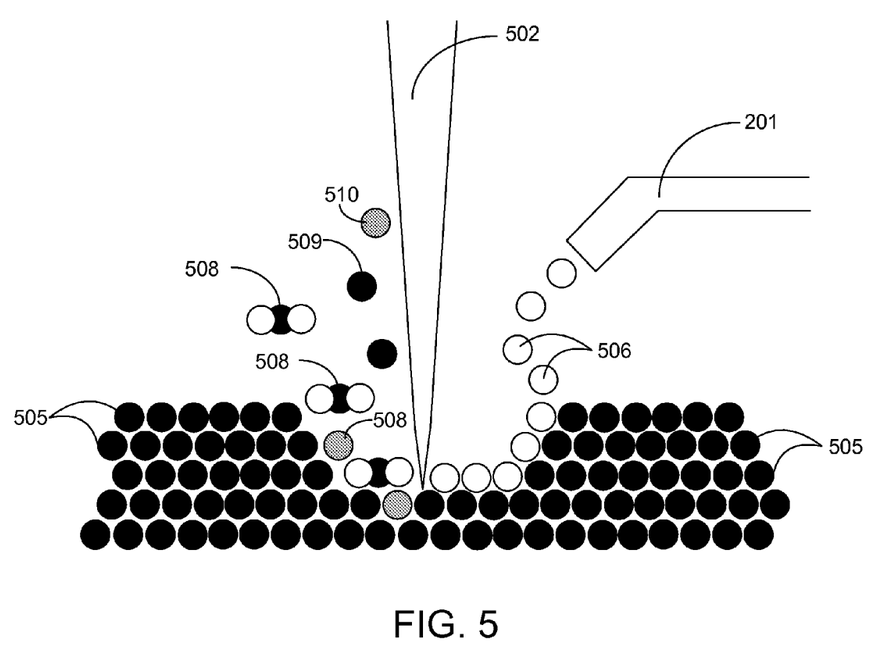
FIG. 5 is a schematic illustration of $O_2$-assisted etching using the $Xe^+$ plasma FIB at lower acceleration voltages.

At lower beam energies, Applicant believes that there is much less damage to the polyimide resulting from the ion beam. As a result, the oxygen chemistry does have an opportunity to enhance etching of the undamaged polyimide. FIG. 5 is a schematic illustration of gas-assisted ($O_2$) etching using the $Xe^+$ plasma FIB 502 at lower acceleration voltages (from 8 keV to 14 keV). For example, the etching could be performed using a $Xe^+$ plasma FIB having a current density greater than 0.5 $pA/\mu m^2$, a dwell time of less than 1000 ns, and a chamber pressure of greater than $0.1 \times 10^{-5}$ Torr. In one embodiment, the beam is a $Xe^+$ plasma FIB at 8 keV, the current is 4 $pA/\mu m^2$, the dwell time=100 nsec, pixel overlap=0%, chamber pressure with $O_2$ valve open=$2 \times 10^{-5}$ Torr. These conditions have been experimentally determined to result in a removal rate of ~9.8 $\mu m^3/nC$, where as the conventional approach to etching polyimide using a $Xe^+$ plasma FIB (water assisted etching at 30 keV) results in a removal rate of only ~0.35 $\mu m^3/nC$. In this instance, the removal rate achieved using a preferred embodiment of the present invention is more than 25× the removal rate when using water-assisted etching.

Applicant believes that the lower energy ions do not cause the creation of a significant passivation layer as seen in the example of FIG. 4. Thus, the $O_2$ molecules 506 introduced are adsorbed onto undamaged polyimide. The ion beam 202 scanning over a defined area activates (or cracks) the adsorbed $O_2$ molecules 506 of the precursor gas, which then react with the surface molecules 505 to promoting etching of the underlying surface. Volatile components 508 of the process then leave the surface and are pumped away by the vacuum system, along with some surface molecules removed by sputtering 509. Although some polyimide molecules may be damaged even at these lower beam energies, those damaged molecules 510 will likely be removed by the physical sputtering action of the beam.

The chemical reactions described herein represent the Applicant's understanding of how various embodiments of the invention function and are presented to assist a skilled person in extending the example described herein to other embodiments, but the invention has been shown to work, regardless of whether or not applicants' understanding of the underlying theory is correct.

The physics behind why $O_2$ is more effective than water is still being studied, and is not yet well-understood. The theories described herein represent the Applicant's understanding of how various embodiments of the invention function and are presented to assist a skilled person in extending the example described herein to other embodiments. Nevertheless, the empirical observation that $O_2$ is superior to water as an etch-assisting gas for use in etching polyimide with a $Xe^+$ plasma FIB is incontrovertible, regardless of whether or not Applicant's understanding of the underlying theory is correct.

Figure 6:
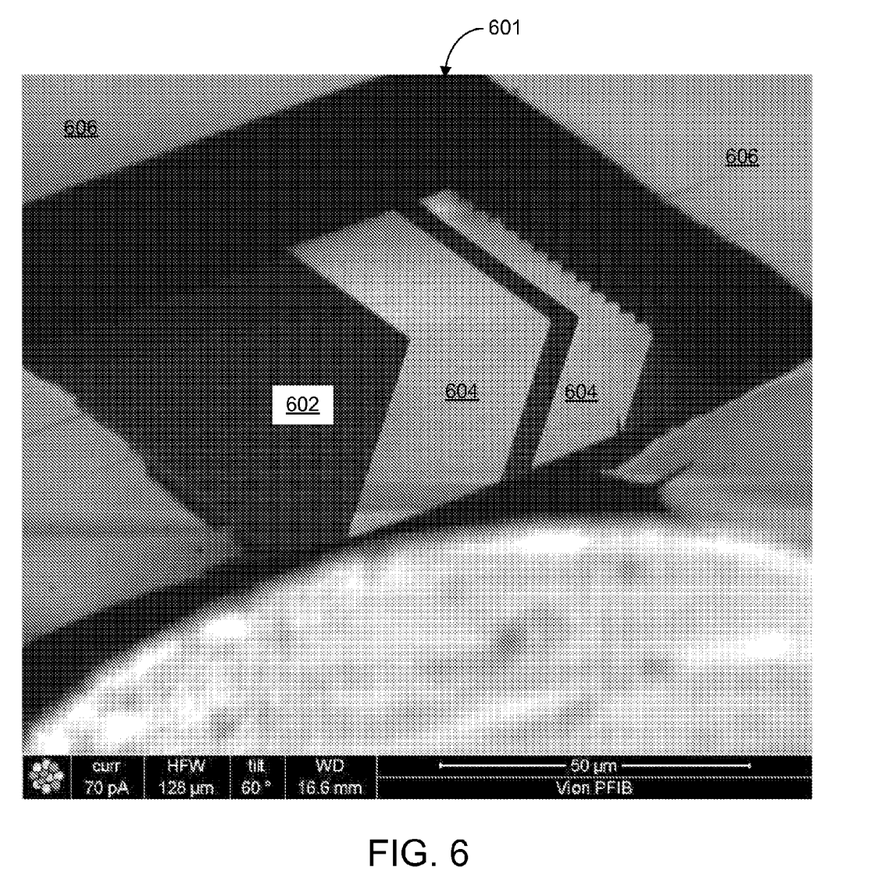
FIG. 6 is a FIB photomicrograph of a polyimide etch using a lower energy $Xe^+$ plasma ion beam.

FIG. 6 is a FIB photomicrograph of a polyimide etch using a lower energy (8 keV to 14 keV) $Xe^+$ plasma ion beam. At the bottom of the trench 601 the oxide 602, which is the dark material, appears to be at the same height of the metal lines 604, which are the bright elbow-shaped features. The planar trench bottom results from the selectivity of the oxygen-assisted etch because the oxygen does not cause the metal or the oxide to etch in the presence of the FIB. Instead, the polyimide is selectively removed and the other features left undamaged.

As also shown in FIG. 6, the surface of the polyimide 606 surrounding the trench also shows the light gray contrast indicating damage by the ion beam. In the work piece of FIG. 6, this damage was the result of the setup to navigational phase (to locate the desired location for the trench) using the $Xe^+$ plasma ion beam at 30 keV. As long as there is no electrical leakage between critical beveled lines of the IC device resulting from this damage, it will typically not be necessary to repair this surface damage in any kind of global manner.

Although the discussion above has focused on the use of $O_2$ as an etch-assisting gas, other gases, including but not limited to $N_2O$, $NO_2$, $NO$, $NO_X$, and other strong oxidizing agents may also be effective or even perform better than $O_2$. Applicant also notes that different compositions of polyimide may behave differently. For example, subsequent to the experimental results noted above, a different composition of polyimide was investigated. Although the second type of polyimide behaved somewhat differently, the results were certainly consistent. For the second work piece, the ion energy for optimal removal was slightly higher (10-14 keV), and the maximum removal rate was slightly lower (6.2 $um^3/nC$). Nevertheless, the methods described herein still produced greatly improved polyimide etching using a $Xe^+$ plasma FIB as compared to the prior art, more than 17× the conventional removal rates described above.

Figure 7:
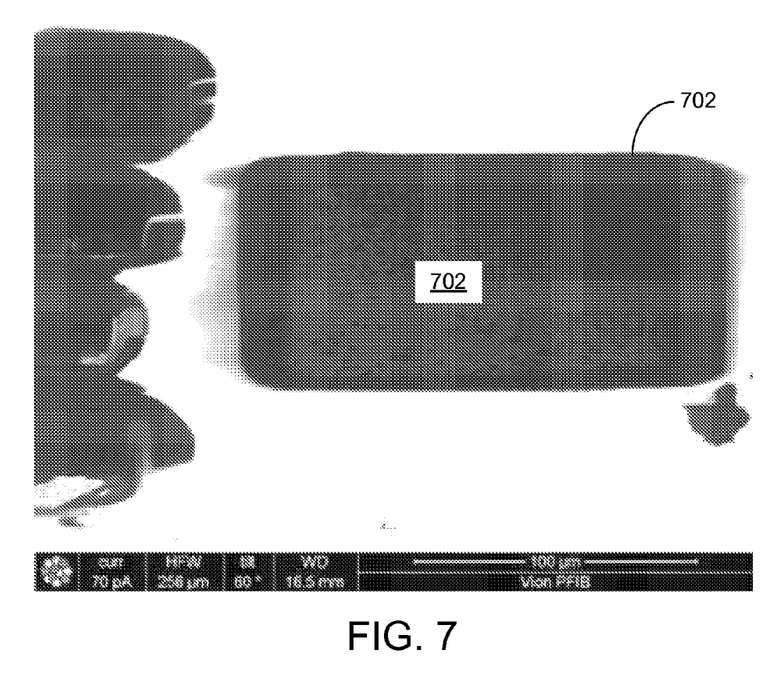
FIG. 7 is a FIB photomicrograph of a large-area polyimide removal where an upper layer of polyimide has been etched away to expose the interface between two sequentially deposited polyimide layers.
Figure 8:
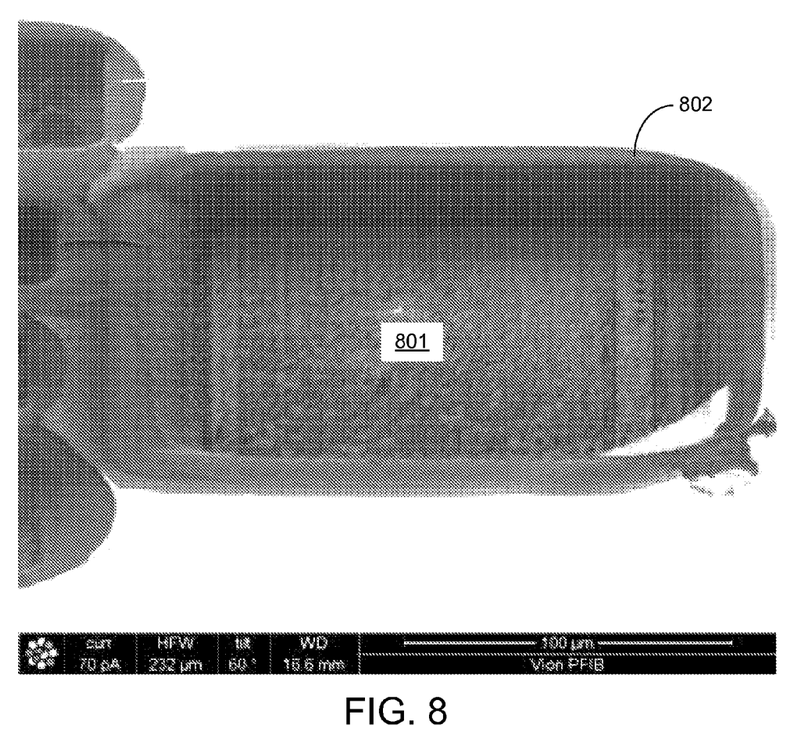
FIG. 8 is a FIB photomicrograph of the large-area polyimide removal of FIG. 7 with the lower polyimide layer etched away and an underlying layer of oxide exposed.

FIG. 7 is a FIB photomicrograph of a polyimide etch where an upper layer of polyimide has been etched away to expose the interface between two sequentially deposited polyimide layers. FIG. 8 illustrates another example 800 of large-area polyimide removal. The dark material 801 at the bottom of trench 802 is exposed silicon dioxide.

Figure 9:
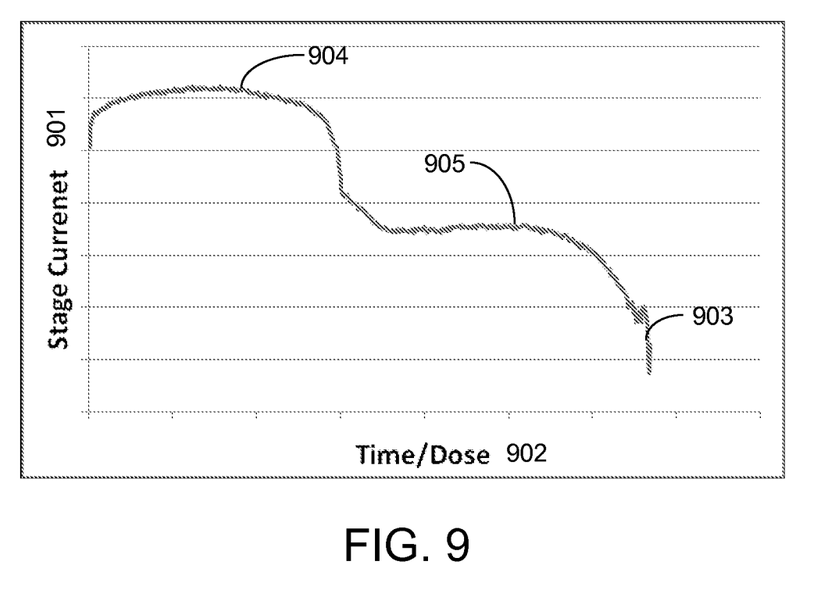
FIG. 9 is a plot of absorbed (stage) current as a function of time during the polyimide etch process of an embodiment of the invention.

FIG. 9 is a plot 900 of absorbed (stage) current 901 as a function of time 902 during the polyimide etch process of the invention. Curve 903 shows two plateaus 904 and 905, corresponding to the removal of different layers of the composite polyimide overcoating. These characteristic features in the endpoint plot give the operator and indication of how deep the FIB-mill has progressed.

As discussed above, although polyimide is normally an electrical insulator (and thus appears dark in FIB images) exposure to high-energy ions can damage the material, transforming it into a partially conductive substance and causing it to appear bright in FIB images. During Circuit Edit (CE), the presence of electrical leakage pathways from damaged and conductive polyimide can cause an edit to fail. Similarly, Failure Analysis (FA) applications involving passive voltage-contrast isolation cuts cannot tolerate electrical leakage, which could also be caused by electrically conductive polyimide.

The methods described above can also be used to "repair" damaged polyimide after FIB processing, thus restoring its electrical insulative properties, and making it appear dark again in FIB images. This allows FIB tools, especially $Xe^+$ plasma tools, to be used with a wider range of CE and FA applications involving polyimide, without fear that the FIB processing has fundamentally altered the electrical properties of the work piece. Significantly, a polyimide repair according to this embodiment of the present invention can be used with both Ga+ and Xe+ FIB systems.

Figure 10:
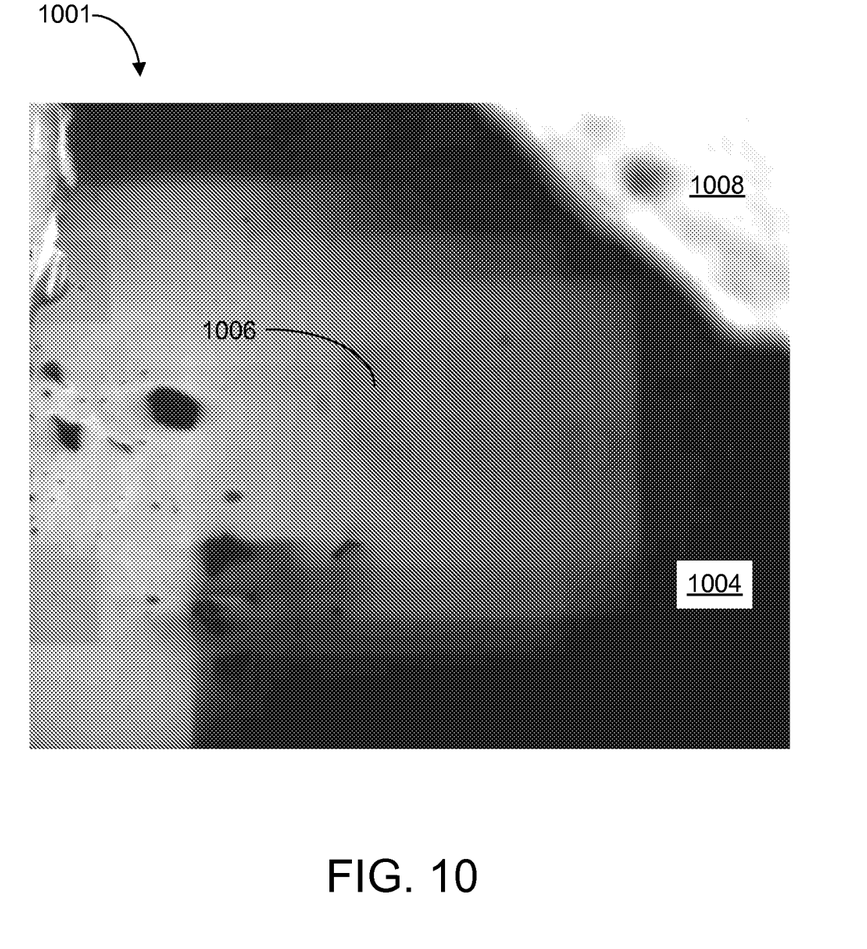
FIG. 10 is a low-magnification FIB micrograph of a partially-damaged polyimide surface.

FIG. 10 is a low-magnification FIB micrograph of a partially-damaged polyimide surface 1001. The dark regions 1004 at the lower right of the figure are undamaged insulative polyimide. The lighter regions 1006 at the left and center of the figure are damaged polyimide and appear to be partially electrically conductive as a result of exposure to high energy (30 keV) $Xe^+$ ions. The bright object 1008 at the upper right is the end of a gas injection nozzle.

Figure 11:
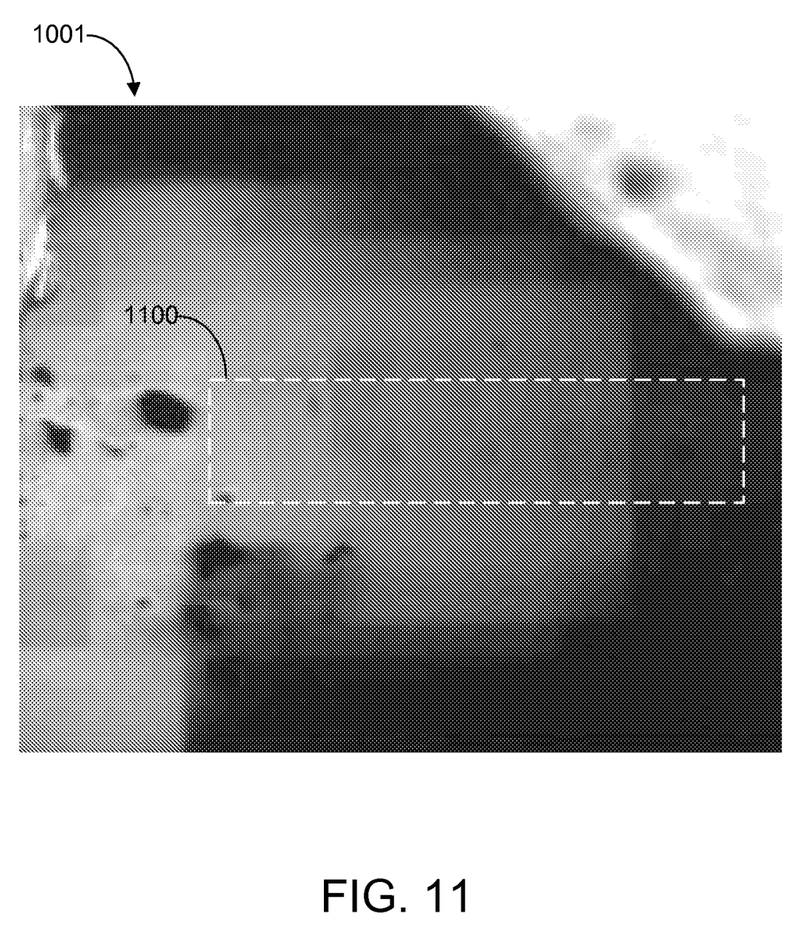
FIG. 11 shows the same section of polyimide film 1001 as FIG. 10, with rectangular scan box showing the location of the repair to be performed.
Figure 12:
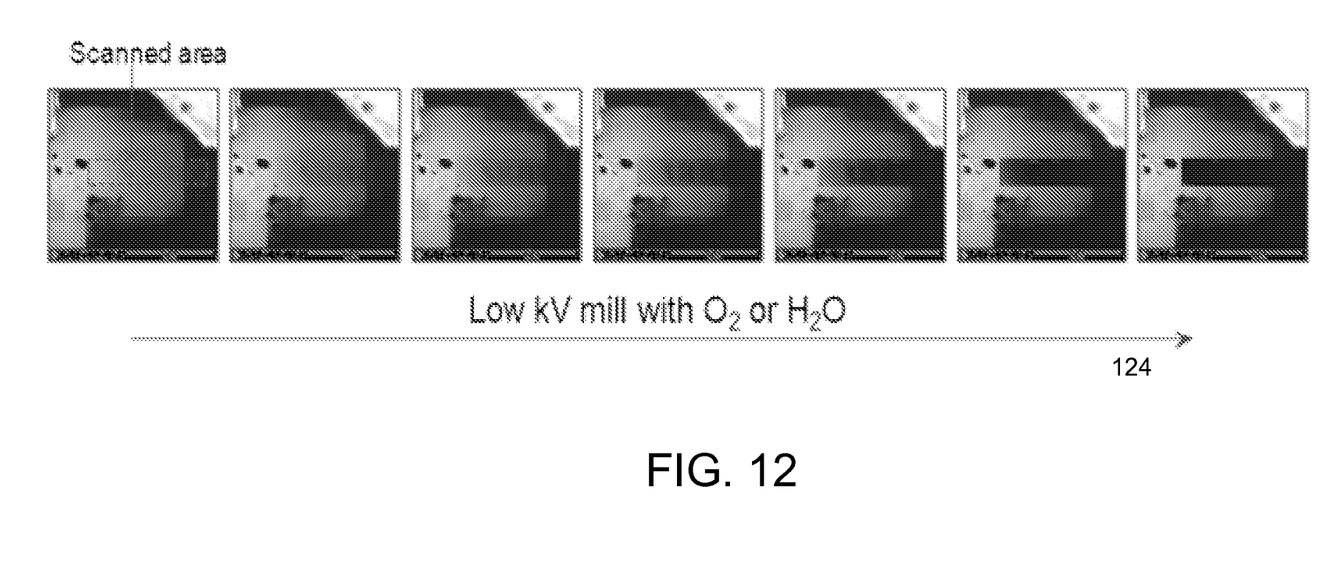
FIG. 12 shows a sequence of FIB images illustrating the progress of the repair of the damaged polyimide film of FIGS. 10 and 11.

This damaged polyimide can be repaired using a low energy ($\leq 8$ keV) ions in the presence of either water or $O_2$. FIG. 11 shows the same section of polyimide film 1001 as FIG. 10, with rectangular scan box 1110 showing the location of the repair to be performed. The damaged polyimide will gradually be consumed as the ion beam scans the area within scan box 1110 in the presence of $O_2$, and the bright glow in the FIB image will subside. Note that the damaged polyimide is not actually being "repaired," but is instead being slowly and gradually removed using the gas-assisted low energy etch. FIG. 12 shows a sequence of FIB images illustrating the progress of the repair of the damaged polyimide film of FIGS. 10 and 11. A central scanned area 1110 is exposed to low energy (8 keV) $Xe^+$ ions in the presence of oxygen. As the repair proceeds over time (arrow 124) and the polyimide is etched at low energies with oxygen, the damaged bright region within the scan box becomes dark in the FIB images as the damaged polyimide is gradually removed to expose undamaged polyimide underneath. Note that it is possible to selectively remove damaged portions of the polyimide with low energy $Xe^+$ without introducing additional damage to the underlying polyimide due to the lower energy of the $Xe^+$ ions (8 keV vs. 30 keV to produce the original damaged region). For this type of polyimide repair, specific tool parameters may vary, but typically the ion energy ranges from 8 to 12 keV, the chamber pressure (with oxygen flowing) is approximately $1 \times 10^{-5}$ torr, pixel dwell times of 100 ns, and a pixel overlap of 0%.

Applicant has determined that for this type of limited material removal, other gases including water vapor, $N_2O$, $NO_2$, NO, and other strong oxidizing agents may be effective as etch-assisting gases. The ion energy is a significant component to the process. Regardless of the gas used, if the ion energy is too high (>8 keV) the accumulation of damage will outpace the removal of the damaged byproducts. While the embodiments above describe directing a gas toward the work piece in a high vacuum chamber, the invention can be implemented in an environmental scanning electron microscope or an environmental cell in which the gas is contained by the work piece surface. While embodiments above described etching of polyimide, any carbonaceous material or organic material can be etched by embodiments of the invention. Other materials can be etched and other etch-assisting gases can be used, with the ion energy being sufficient low so as to not form an etch resistant passivation layer yet sufficiently high to etch the substrate material.

In accordance with some embodiments of the present invention, a method of chemically-enhanced ion beam milling of a work piece including a carbonaceous material comprises providing an oxygen-containing, etch-assisting gas at the surface of the work piece and directing the ion beam, which has insufficient energy to form a passivation layer from a reaction between the oxygen-containing, etch-assisting gas which comprises the oxygen and the carbonaceous material, toward the carbonaceous material to etch the carbonaceous material in the presence of the etch assisting gas.

In some embodiments, the method in which directing the ion beam toward the carbonaceous material includes directing an ion beam having less than 16 keV. Yet in some embodiments, the method in which directing the ion beam toward the carbonaceous material includes directing an ion beam having less than 10 keV.

In some embodiments, the method in which directing the ion beam toward the carbonaceous material includes directing a beam of xenon ions. Yet in some embodiments, the method in which directing the ion beam toward the carbonaceous material includes directing a beam of xenon ions having energy of less than 16 keV towards a polyimide material. In some embodiments, the method in which directing an oxygen-containing, etch-assisting gas toward the work piece comprises directing $O_2$ toward the work piece.

In accordance with some embodiments of the present invention, a method of chemically-enhanced ion beam milling of a substrate comprises loading the substrate into an ion beam system, providing an etch-assisting gas, which comprises an oxidizing agent, toward the work piece, directing the ion beam, which has a beam energy of less than 16 keV, at the work piece in the presence of the etch assisting gas, and removing material using chemically-enhanced ion beam milling.

In some embodiments, the method in which the etch-assisting gas comprises $O_2$ gas. Yet in some embodiments, the method in which the etch-assisting gas comprises $N_2O$, $NO_2$, NO, or $NO_X$.

In some embodiments, the method in which the substrate comprises polyimide or other organic films. Yet in some embodiments, the method in which the ion beam has a beam energy of 8 to 14 keV. In some embodiments, the method in which removing material using chemically-enhanced ion beam milling comprises ion beam sputtering or etching the substrate.

In some embodiments, the method in which the ion beam system comprises a $Xe^+$ plasma focused ion beam system or other plasma focused ion beam systems. Yet in some embodiments, the method in which no significant passivation layer is formed on the substrate by the interaction of the ions, the etch-assisting gas, and the substrate. In some embodiments, the method in which the ion beam system has a current density of 4 $\mu pA/\mu m^2$, dwell time of 100 ns, pixel overlap of 0%, and a chamber pressure of $2 \times 10^{-5}$ Torr.

In some embodiments, the method in which the milling rate is greater than 0.3 $\mu m^3/nC$. Yet in some embodiments, the method in which removing material using a chemically enhanced ion beam comprises removing a damaged polyimide layer to expose an undamaged layer, which does not get damaged by the ion beam and retains its electrical insulative properties, of polyimide underneath the damaged layer. In some embodiments, the method in which the ion beam has a beam energy less than or equal to 8 keV.

In some embodiments, the method in which the etch-assisting gas comprises water vapor, $O_2$, $N_2O$, $NO_2$, NO, or $NO_X$. Yet in some embodiments, the method in which the ion beam system comprises a $Ga^+$ plasma focused ion beam system or a $Xe^+$ plasma focused ion beam system.

Although the description of the present invention above is mainly directed at methods of etching polyimide or other similar organic films, it should be recognized that an apparatus performing the operation of such a method would further be within the scope of the present invention. Further, it should be recognized that embodiments of the present invention can be implemented via computer hardware, a combination of both hardware and software, or by computer instructions stored in a non-transitory computer-readable memory. The methods can be implemented in computer programs using standard programming techniques—including a non-transitory computer-readable storage medium configured with a computer program, where the storage medium so configured causes a computer to operate in a specific and predefined manner—according to the methods and figures described in this Specification. Each program may be implemented in a high level procedural or object oriented programming language to communicate with a computer system. However, the programs can be implemented in assembly or machine language, if desired. In any case, the language can be a compiled or interpreted language. Moreover, the program can run on dedicated integrated circuits programmed for that purpose.

Further, methodologies may be implemented in any type of computing platform, including but not limited to, personal computers, mini-computers, main-frames, workstations, networked or distributed computing environments, computer platforms separate, integral to, or in communication with charged particle tools or other imaging devices, and the like. Aspects of the present invention may be implemented in machine readable code stored on a storage medium or device, whether removable or integral to the computing platform, such as a hard disc, optical read and/or write storage mediums, RAM, ROM, and the like, so that it is readable by a programmable computer, for configuring and operating the computer when the storage media or device is read by the computer to perform the procedures described herein. Moreover, machine-readable code, or portions thereof, may be transmitted over a wired or wireless network. The invention described herein includes these and other various types of computer-readable storage media when such media contain instructions or programs for implementing the steps described above in conjunction with a microprocessor or other data processor. The invention also includes the computer itself when programmed according to the methods and techniques described herein.

Computer programs can be applied to input data to perform the functions described herein and thereby transform the input data to generate output data. The output information is applied to one or more output devices such as a display monitor. In preferred embodiments of the present invention, the transformed data represents physical and tangible objects, including producing a particular visual depiction of the physical and tangible objects on a display.

Preferred embodiments of the present invention also make use of a particle beam apparatus, such as a FIB or SEM, in order to image a work piece using a beam of particles. Such particles used to image a work piece inherently interact with the work piece resulting in some degree of physical transformation. Further, throughout the present specification, discussions utilizing terms such as "calculating," "determining," "measuring," "generating," "detecting," "forming," or the like, also refer to the action and processes of a computer system, or similar electronic device, that manipulates and transforms data represented as physical quantities within the computer system into other data similarly represented as physical quantities within the computer system or other information storage, transmission or display devices.

The invention has broad applicability and can provide many benefits as described and shown in the examples above. The embodiments will vary greatly depending upon the specific application, and not every embodiment will provide all of the benefits and meet all of the objectives that are achievable by the invention. Particle beam systems suitable for carrying out the present invention are commercially available, for example, from FEI Company, the assignee of the present application.

Although much of the previous description is directed at semiconductor wafers, the invention could be applied to any suitable substrate or surface. Further, whenever the terms "automatic," "automated," or similar terms are used herein, those terms will be understood to include manual initiation of the automatic or automated process or step. In the following discussion and in the claims, the terms "including" and "comprising" are used in an open-ended fashion, and thus should be interpreted to mean "including, but not limited to . . . ." The term "integrated circuit" refers to a set of electronic components and their interconnections (internal electrical circuit elements, collectively) that are patterned on the surface of a microchip. The term "semiconductor device" refers generically to an integrated circuit (IC), which may be integral to a semiconductor wafer, singulated from a wafer, or packaged for use on a circuit board. The term "FIB" or "focused ion beam" is used herein to refer to any collimated ion beam, including a beam focused by ion optics and shaped ion beams.

To the extent that any term is not specially defined in this specification, the intent is that the term is to be given its plain and ordinary meaning. The accompanying drawings are intended to aid in understanding the present invention and, unless otherwise indicated, are not drawn to scale.

Although the present invention and its advantages have been described in detail, it should be understood that various changes, substitutions and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

I claim as follows:

1. A method of chemically-enhanced focused ion beam milling of a work piece including a carbonaceous material, the method comprising:

providing from a first source an oxygen-containing, etch-assisting gas at the surface of the work piece so that gas molecules are adsorbed onto the work piece surface and react with the work piece surface to promote etching; and directing a focused ion beam from a second source toward the carbonaceous material to etch the carbonaceous material in the presence of the oxygen-containing, etch-assisting gas, the focused ion beam having insufficient energy to form a passivation layer comprising the oxygen and the carbonaceous material from a reaction between the oxygen-containing, etch-assisting gas and the carbonaceous material.

2. The method of claim 1 in which directing the focused ion beam toward the carbonaceous material includes directing an focused ion beam having a beam energy of less than 16 keV.

3. The method of claim 1 in which directing the focused ion beam toward the carbonaceous material includes directing a focused ion beam having a beam energy of less than 10 keV.

4. The method of claim 1 in which directing the focused ion beam toward the carbonaceous material includes directing a beam of xenon ions.

5. The method of claim 1 in which directing the focused ion beam toward the carbonaceous material includes directing a beam of xenon ions having a beam energy of less than 16 keV towards a polyimide material.

6. The method of claim 5 in which directing an oxygen-containing, etch-assisting gas toward the work piece comprises directing $O_2$ toward the work piece.

7. A method of chemically-enhanced focused ion beam milling of a substrate comprising carbonaceous material, the method comprising:
  loading the substrate into a focused ion beam system;
  providing from a first source an etch-assisting gas toward the substrate, the etch-assisting gas comprising an oxidizing agent so that gas molecules adsorb onto the substrate to react with the substrate to promote etching;
  directing a focused ion beam at the substrate from a second source in the presence of the etch-assisting gas, the focused ion beam having a beam energy of less than 16 keV; and
  removing carbonaceous material from the substrate using chemically-enhanced focused ion beam milling.

8. The method of claim 7 in which the etch-assisting gas comprises $O_2$ gas.

9. The method of claim 7 in which the etch-assisting gas comprises $N_2O$, $NO_2$, $NO$, or $NO_X$.

10. The method of claim 7 in which the carbonaceous material is polyimide in the form of a film.

11. The method of claim 7 in which the focused ion beam has a beam energy of 8 to 14 keV.

12. The method of claim 7 in which removing carbonaceous material from the substrate using chemically-enhanced focused ion beam milling comprises focused ion beam sputtering and gas-assisted etching of the substrate.

13. The method of claim 7 in which the focused ion beam system comprises a $Xe^+$ plasma focused ion beam system.

14. The method of claim 7 in which no significant passivation layer is formed on the substrate by an interaction of ions of the focused ion beam, the etch-assisting gas, and the carbonaceous material.

15. The method of claim 7 in which the focused ion beam system has a current density greater than of 0.5 pA/$\mu m^2$, dwell time of less than 1000 ns, and a chamber pressure of greater than $0.1 \times 10^{-5}$ Torr.

16. The method of claim 7 in which the milling rate is greater than 0.3 $\mu m^3$/nC.

17. The method of claim 7 in which removing carbonaceous material from the substrate using chemically-enhanced focused ion beam milling comprises removing a damaged polyimide layer to expose an undamaged layer of polyimide underneath the damaged layer, the undamaged layer does not get damaged by the focused ion beam and retains its electrical insulative properties.

18. The method of claim 17 in which the focused ion beam has a beam energy less than or equal to 8 keV.

19. The method of claim 17 in which the etch-assisting gas comprises water vapor, $O_2$, $N_2O$, $NO_2$, $NO$, or $NO_X$.

20. The method of claim 17 in which the focused ion beam system comprises a Ge plasma focused ion beam system or a $Xe^+$ plasma focused ion beam system.

21. The method of claim 1 in which the oxygen-containing, etch-assisting gas comprises an oxygen-containing, etch-assisting gas other than water and the focused ion beam is a $Xe^+$ plasma focused ion beam.

* * * * *

UNITED STATES PATENT AND TRADEMARK OFFICE
CERTIFICATE OF CORRECTION

PATENT NO.        : 9,443,697 B2
APPLICATION NO.   : 13/717272
DATED             : September 13, 2016
INVENTOR(S)       : Chad Rue It is certified that error appears in the above-identified patent and that said Letters Patent is hereby corrected as shown below:

In the Claims

Column 12, Line 32 -- Please change "a Ge plasma" to read --Ga+ plasma--

Signed and Sealed this
Fifteenth Day of November, 2016

Michelle K. Lee
*Director of the United States Patent and Trademark Office*